(12) United States Patent
Glaeser et al.

(10) Patent No.: US 10,559,449 B2
(45) Date of Patent: Feb. 11, 2020

(54) STABLE SUPPORT FILMS FOR ELECTRON MICROSCOPY

(71) Applicant: The Regents of the University of California, Oakland, CA (US)

(72) Inventors: Robert M. Glaeser, Berkeley, CA (US); Bong-Gyoon Han, Castro Valley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/844,854

(22) Filed: Dec. 18, 2017

(65) Prior Publication Data

US 2018/0108510 A1    Apr. 19, 2018

Related U.S. Application Data

(63) Continuation of application No. PCT/US2016/038683, filed on Jun. 22, 2016.

(60) Provisional application No. 62/184,532, filed on Jun. 25, 2015.

(51) Int. Cl.
*H01J 37/20* (2006.01)
*H01J 37/26* (2006.01)

(52) U.S. Cl.
CPC .......... *H01J 37/20* (2013.01); *H01J 37/261* (2013.01); *H01J 2237/2007* (2013.01)

(58) Field of Classification Search
None
See application file for complete search history.

(56) References Cited

U.S. PATENT DOCUMENTS

| 8,581,205 B2* | 11/2013 | Wei | H01J 37/20 |
| | | | 250/440.11 |
| 2010/0202672 A1* | 8/2010 | Sinclair | C07K 14/001 |
| | | | 382/128 |
| 2013/0164379 A1* | 6/2013 | Gartel | A61K 31/69 |
| | | | 424/490 |

(Continued)

FOREIGN PATENT DOCUMENTS

| WO | WO1987005300 | 10/1987 |
| WO | WO2009154688 | 5/2009 |

(Continued)

OTHER PUBLICATIONS

Han et al. ("Electron microscopy of biotinylated protein complexes bound to streptavidin monolayer crystals", Journal of Structural Biology 180,249-253. 2012).*

(Continued)

*Primary Examiner* — Andrew Smyth

(57) ABSTRACT

This disclosure provides systems, methods, and apparatus related to arrangements including electron microscopy grids. In one aspect an arrangement includes an electron microscopy grid. The electron microscopy grid comprises a first surface and a second surface, with the first surface having a holey carbon film disposed thereon. A plurality of lipid molecules are disposed in a hole in the holey carbon film. Each lipid molecule of the plurality of lipid molecules has a hydrophilic head and a hydrophobic tail. A biotin-binding protein is attached to the hydrophilic heads of the plurality of lipid molecules. The biotin-binding protein is crystalline.

21 Claims, 7 Drawing Sheets

(56) References Cited

U.S. PATENT DOCUMENTS

2014/0079936 A1* 3/2014 Russo ............... B81B 1/002
428/220

FOREIGN PATENT DOCUMENTS

WO WO 2009154688 A1 * 12/2009 ............ H01J 37/20
WO WO-2009154688 A1 * 12/2009 ............ H01J 37/20

OTHER PUBLICATIONS

Reviakine, et al. ("Streptavidin 2D crystals on supported phospholipid bilayers: toward constructing anchored phospholipid bilayers." Langmuir. 2001, vol. 17, No. 26, 8293.).*

Schmitt et al. ("Surface-plasmon microscopic observation of site-selective recognition reactions." Biophysical Journal. 1991, vol. 60, No. 3, 716.).*

Darst et al. ("Two-Dimensional Crystals of Streptavidin on Biotinylated Lipid Layers and Their Interactions with Biotinylated Macromolecules", Biophysical Journal 59, 387-396, 1991).*

Llaguno, M.C., et al., 2014. Chemically functionalized carbon films for single molecule imaging. Journal of Structural Biology 185, 405-417.

Wang, L.G., et al., 2008. Streptavidin crystals as nanostructured supports and image calibration references for cryo-EM data collection. Journal of Structural Biology 164, 190-198.

Darst, S.A., et al., 1991. 2-Dimensional Crystals of Streptavidin on Biotinylated Lipid Layers and Their Interactions with Biotinylated Macromolecules. Biophysical Journal 59, 387-396.

Kelly, D.F., et al., 2008. The affinity grid: A pre-fabricated EM grid for monolayer purification. Journal of Molecular Biology 382, 423-433.

Bong-Gyoon Han et al., "Long shelf-life streptavidin support-films suitable for electron microscopy of biological macromolecules," posted on biorxiv.org, May 20, 2016.

Crucifix, C., et al., 2004. Immobilization of biotinylated DNA on 2-D streptavidin crystals. Journal of Structural Biology 146, 441-451.

Han, B.G., et al., 2012. Electron microscopy of biotinylated protein complexes bound to streptavidin monolayer crystals. Journal of Structural Biology 180, 249-253.

Hebert, H., et al., 1997. The 3.0 angstrom projection structure of microsomal glutathione transferase as determined by electron crystallography of p2(1)2(1)2 two-dimensional crystals. Journal of Molecular Biology 271, 751-758.

Leong, P.A., et al., 2010. Correcting for the Ewald sphere in high-resoluiton single-particle reconstructions, p. 369-380, in: Jensen, G J, (Ed.), Methods in Enzymology, vol. 482: Cryo-Em, Part B: 3-D Reconstruction, vol. 482, pp. 369-380.

Tang, G., et al., 2007. EMAN2: An extensible image processing suite for electron microscopy. Journal of Structural Biology 157, 38-46.

Wang, L.G., et al., 2010. Liposomes on a streptavidin crystal: a system to study membrane proteins by cryo-EM p. 147-164, in: Jensen, G J, (Ed.), Methods in Enzymology, vol. 481: Cryo-Em, Part a—Sample Preparation and Data Collection, vol. 481, pp. 147-164.

Zhou, Z.H., 2008. Towards atomic resolution structural determination by single-particle cryo-electron microscopy. Current Opinion in Structural Biology 18, 218-228.

International Search Report and Written Opinion for International Application No. PCT/US16/38683 dated Oct. 31, 2016.

Schmitt, FJ et al. "Surface-plasmon microscopic observation of site-selective recognition reactions." Biophysical Journal. 1991, vol. 60, No. 3, 716.

Reviakine, I et al. "Streptavidin 2D crystals on supported phospholipid bilayers: toward constructing anchored phospholipid bilayers." Langmuir. 2001, vol. 17, No. 26, 8293.

Grassucci, RA et al. "Preparation of macromolecular complexes for cryo-electron microscopy." Nature protocols. 2007, vol. 2, No. 12, 3239.

Kelly, D. F., et al., "Strategy for the Use of Affinity Grids to Prepare Non-His-Tagged Macromolecular Complexes for Single-Particle Electron Microscopy," J. Mol. Biol. (2010) 400, 675-681.

Sharma, G., et al., "Affinity grid-based cryo-EM of PKC binding to RACK1 on the ribosome," Journal of Structural Biology 181 (2013) 190-194.

Yu, G., et al., "Single-step antibody-based affinity cryo-electron microscopy for imaging and structural analysis of macromolecular assemblies," Journal of Structural Biology 187 (2014) 1-9.

Degen, K., et al., "The development of affinity capture devices—a nanoscale purification platform for biological in situ transmission electron microscopy," RSC Advances, 2012, 2, 2408-2412.

* cited by examiner

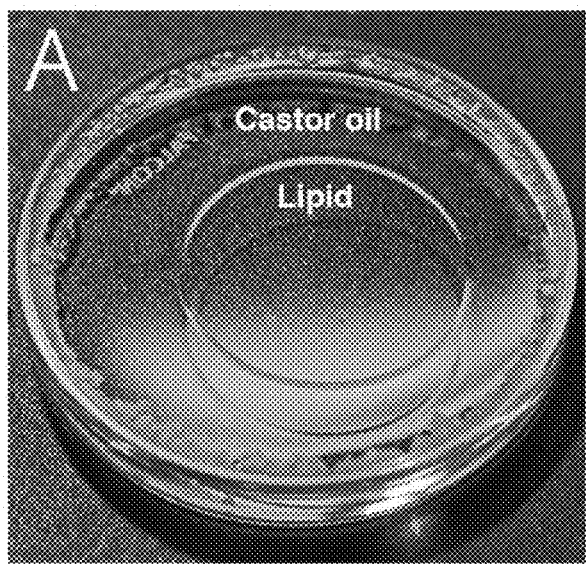 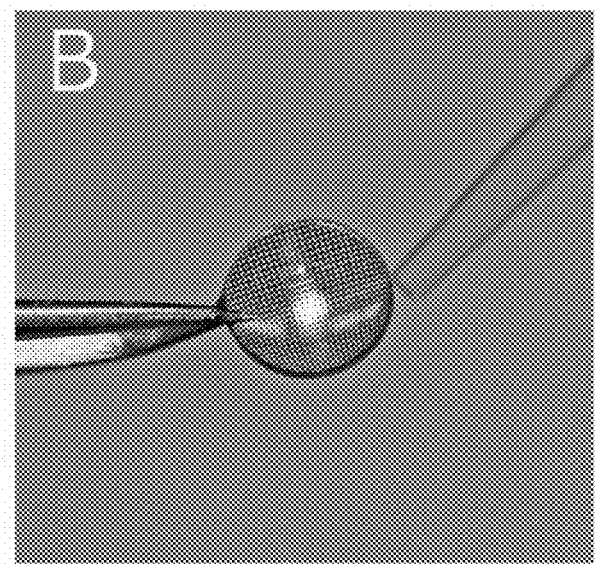
Figure 2A                    Figure 2B

STABLE SUPPORT FILMS FOR ELECTRON MICROSCOPY

RELATED APPLICATIONS

This application is a continuation of International Application No. PCT/US2016/038683, filed Jun. 22, 2016, which claims priority to U.S. Provisional Patent Application No. 62/184,532, filed Jun. 25, 2015, both of which are herein incorporated by reference.

STATEMENT OF GOVERNMENT SUPPORT

This invention was made with government support under Contract No. DE-AC02-05CH11231 awarded by the U.S. Department of Energy and under Grant No. GM083039 from the National Institute of General Medical Sciences. The government has certain rights in this invention.

TECHNICAL FIELD

This disclosure relates generally to electron microscopy grids and more particularly to electron microscopy grids with stable support films disposed thereon.

BACKGROUND

There are a number of reasons to consider using streptavidin monolayer crystals as "affinity" support films for cryo-electron microscopy (cryo-EM). Macromolecules of interest can be easily tagged with biotin or a streptavidin-binding peptide and then bound to streptavidin (SA) with high affinity and specificity. Furthermore, tagging followed by affinity binding is expected to pose less risk to the native structure of the macromolecule than does (1) adsorption of particles to the surface of carbon film, even when rendered hydrophilic by exposure to a glow discharge, or (2) repeated collision with the air-water interface that occurs when freely diffusing macromolecules are confined to a thin aqueous film (Taylor and Glaeser, 2008).

Monolayer crystals of SA have been considered previously by several authors for use as an affinity-support film. One early study viewed SA as being a "general adaptor" for linking any kind of biotinylated molecule to a lipid monolayer (Darst et al., 1991). Chemically biotinylated ferritin was used in that work to show that a high density of randomly distributed particles could be bound to 2-D crystals of SA. In an extension of the adaptor-molecule idea, Crucifix et al. first randomly decorated SA monolayer crystals with biotinylated dsDNA molecules, and then used the immobilized DNA as bait to bind yeast RNA Pol I particles (Crucifix et al., 2004). Wang et al. showed that biotinylated proteoliposomes could be bound at high density (Wang and Sigworth, 2009; Wang et al., 2008), and they introduced the further innovation of eliminating the periodic background due to SA by masking out the Bragg reflections in the computed Fourier transforms of images. Han et al. then went on to demonstrate the generality with which chemical biotinylation of soluble-protein complexes could be used (Han et al., 2012).

In spite of these promising demonstrations, SA monolayer crystals have not been adopted as support films for routine data collection. Two major problems remained with the use of SA monolayer crystals. First, the standard protocol for growing monolayer crystals involves an additional incubation step of 2 hours or more (Wang and Sigworth, 2010), which both slows and complicates the process of preparing cryo-EM specimens. Second, while the results can be excellent, the growth of large, well-ordered crystals on microwells, together with their transfer onto EM grids, is quite inconsistent.

SUMMARY

Described herein is a simplified, on-grid crystallization protocol that yields large SA crystals in times as short as 10 minutes. In addition, trehalose-embedding makes it possible to prepare these grids in advance, with their useful shelf life expected to be months or longer. A thin layer of evaporated carbon also can be deposited on the back side (lipid-tail side) of the trehalose-embedded SA crystals in order to add mechanical stability. In a practical test of these grids, E. coli 70S ribosomes were used to obtain a 3-D reconstruction at a global resolution estimated to be ~4.0 Å, which improved to ~3.9 Å when focused refinement was used for the large subunit.

One innovative aspect of the subject matter described in this disclosure can be implemented in an arrangement including an electron microscopy grid. The electron microscopy grid comprises a first surface and a second surface, with the first surface having a holey carbon film disposed thereon. A plurality of lipid molecules are disposed in a hole in the holey carbon film. Each lipid molecule of the plurality of lipid molecules has a hydrophilic head and a hydrophobic tail. A biotin-binding protein is attached to the hydrophilic heads of the plurality of lipid molecules. The biotin-binding protein is crystalline.

Another innovative aspect of the subject matter described in this disclosure can be implemented in a method including providing an electron microscopy grid. The electron microscopy grid comprises a first surface and a second surface, with the first surface having a holey carbon film disposed thereon. A plurality of lipid molecules are provided. Each lipid molecule of the plurality of lipid molecules has a hydrophilic head and a hydrophobic tail. The holey carbon film is contacted with hydrophobic tails of the plurality of lipid molecules to form a lipid monolayer disposed in a hole in the holey carbon film. The lipid monolayer comprises a portion of the plurality of lipid molecules. A biotin-binding protein is attached to hydrophilic heads of the lipid monolayer. A period of time is allowed to elapse to allow the biotin-binding protein to crystalize.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIGS. 2A and 2B illustrate two operations in the on-grid crystallization technique.

FIG. 4A shows an example of an image in which only a sparse density of ribosomes was obtained in the control experiment, for which the ribosomes were not biotinylated. FIG. 4B shows an example of an image in which a uniform, high density of ribosomes was obtained when the ribosomes were biotinylated.

DETAILED DESCRIPTION

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention. Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a value is close to a targeted value, where close can mean, for example, the value is within 80% of the targeted value, within 90% of the targeted value, within 95% of the targeted value, or within 99% of the targeted value.

Figure 1A:
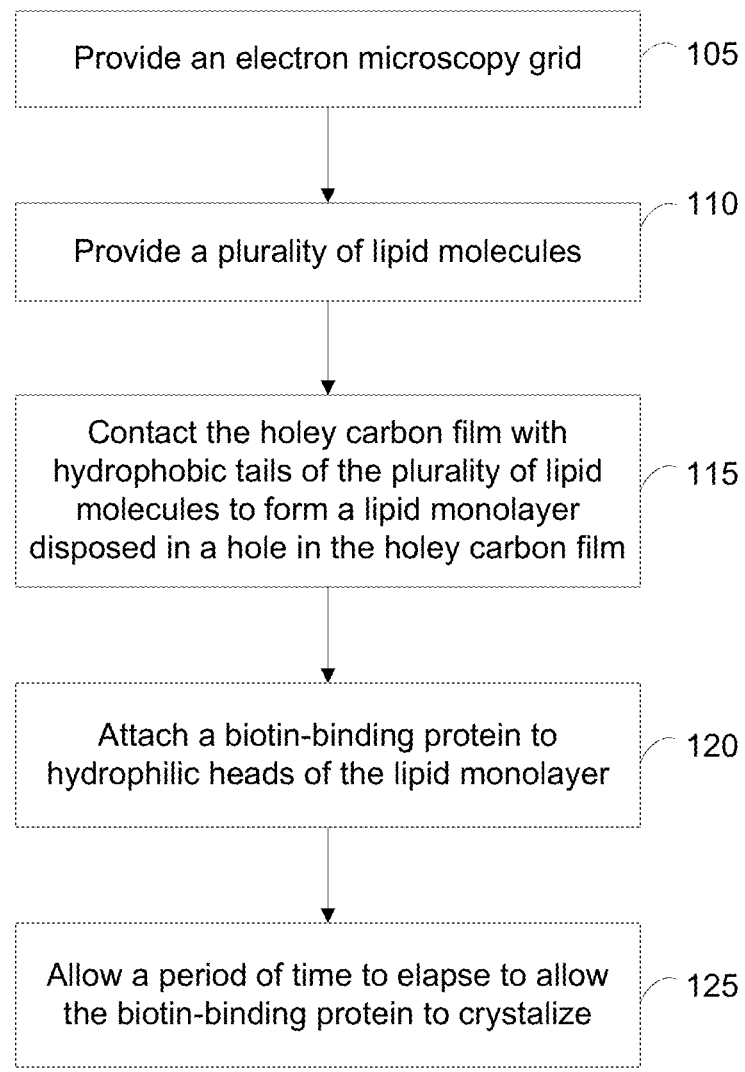
FIG. 1A shows an example of a flow diagram illustrating a method of fabricating an arrangement including an electron microscopy grid.

FIG. 1A shows an example of a flow diagram illustrating a method of fabricating an arrangement including an electron microscopy grid. The arrangement may be used, for example, as a sample support or holder in cryo-electron microscopy of macromolecules. Starting at block 105 of the method 100, an electron microscopy grid is provided. The electron microscopy grid comprises a first surface and a second surface. The first surface has a holey carbon film disposed thereon.

An electron microscopy grid is a grid upon which a sample to be observed in an electron microscope can be placed. The electron microscopy grid can be placed in an electron microscopy specimen holder that can be inserted into the electron microscope. Electron microscopy grids are generally used in transmission electron microscopy (TEM).

An electron microscopy grid can be made of a number of materials or a combination or alloy of such materials. In some embodiments, the electron microscopy grid comprises gold, molybdenum, titanium, or copper. It is believed that molybdenum has a thermal expansion that is matched with carbon, which may desirable in some cases. An electron microscopy grid is generally an about 3.05 millimeter (mm) diameter disc that has a thickness and mesh size ranging from about 3 microns to 100 microns. In some embodiments, an electron microscopy grid has a thickness of about 30 microns and a mesh size of about 100 microns.

A holey carbon film is disposed on one side of the electron microscopy grid that is used in the method 100. Holey carbon films are often used for high resolution studies in conjunction with cryo-electron microscopy. A holey carbon film differs from a continuous carbon film in that a holey carbon film has holes defined in the carbon film. In some embodiments, the holes in the holey carbon film have a specified size. One purpose of the holes in the holey carbon film is to eliminate any absorption and scattering of the electron beam in an electron microscope by the carbon film. Absorption and scattering of the electron beam will generate noise and obstruct the signal. In some embodiments, the holes in the holey carbon film have a cross-sectional dimension of about 1 micron, about 2 microns, or about 1 micron to 2 microns. For example, when the holes in the holey carbon film are circular, the holes have a diameter of about 1 micron, about 2 microns, or about 1 micron to 2 microns. In some embodiments, the holey carbon film has a thickness of about 10 nanometers (nm) to 25 nm, or about 12 nm.

Figure 1B:
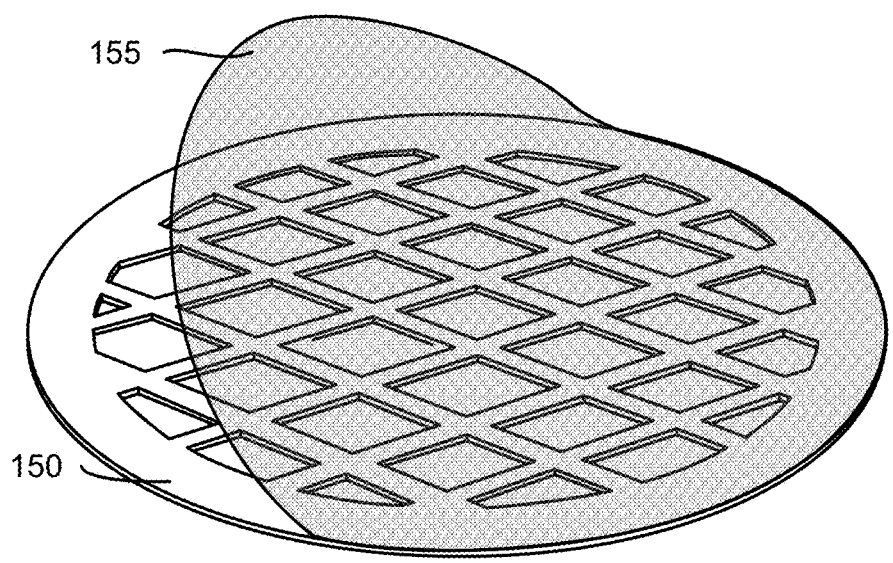
FIGS. 1B and 1C show examples of schematic illustrations of a holey carbon film disposed on an electron microscopy grid.
Figure 1C:
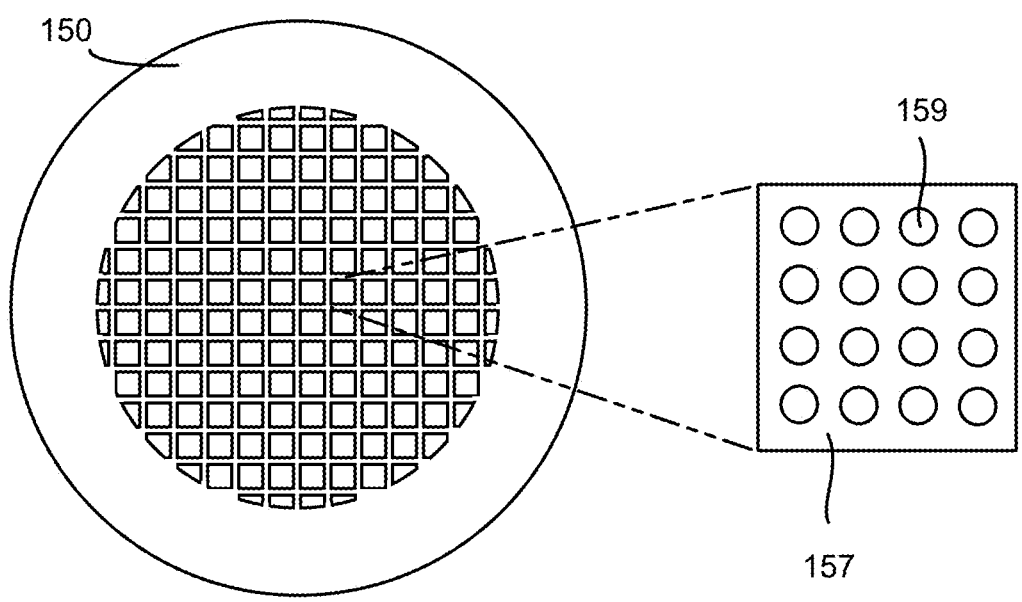

FIGS. 1B and 1C show examples of schematic illustrations of a holey carbon film disposed on an electron microscopy grid. As shown in FIG. 1B, in some embodiments, an electron microscopy grid 150 has a holey carbon film disposed on one side of the electron microscopy grid 150. FIG. 1C shows the holey carbon film 155 disposed over one opening in the mesh 157 of the electron microscopy grid 150. The holey carbon film has holes 159 defined in the carbon film.

At block 110 of the method 100, a plurality of lipid molecules is provided. Each lipid molecule of the plurality of lipid molecules has a hydrophilic head and a hydrophobic tail. In some embodiments, the plurality of lipid molecules comprises a homogenous mixture of lipid molecules with biotinylated head groups. In some embodiments, the plurality of lipid molecules comprises a heterogeneous mixture of lipid molecules, with at least a part of the heterogeneous mixture comprising lipid molecules with biotinylated head groups.

At block 115 of the method 100, the holey carbon film is contacted with hydrophobic tails of the plurality of lipid molecules. In some embodiments, the plurality of lipid molecules form a lipid monolayer before the holey carbon film is contacted with hydrophobic tails of the plurality of lipid molecules. When the electron microscopy grid is subsequently lifted from contact with the plurality of lipid molecules, a portion of plurality of lipid molecules adheres to the holey carbon film and is transferred thereto. Some of the plurality of lipid molecules forms a lipid monolayer disposed in a hole in the holey carbon film. The operation in block 115 may be referred to as a direct transfer method or a Langmuir-Schaefer transfer method (Langmuir and Schaefer, 1938).

In some embodiments, instead of contacting the holey carbon film with hydrophobic tails of the plurality of lipid molecules to form a lipid monolayer in a hole of the holey carbon film, a loop transfer method is used to form the lipid monolayer. The loop transfer method is described in Asturias and Kornberg (1995), "A novel method for transfer of two-dimensional crystals from the air/water interface to specimen grids. EM sample preparation/lipid-layer crystallization," Journal of Structural Biology, 114(1):60-66, which is hereby incorporated by reference.

At block 120, a biotin-binding protein is attached to hydrophilic heads of the lipid monolayer. The biotin-binding protein used is typically able to form well-ordered crystals. In some embodiments, the biotin-binding protein is selected from a group consisting of streptavidin, avidin, NeutrAvidin (i.e., a deglycosylated version of avidin), CaptAvidin (i.e., a biotin-binding protein derived from avidin, in which the tyrosine in the biotin-binding site has been nitrated), and tamavidins. In some embodiments, mutant versions of such biotin-binding proteins are used. In some embodiments, the mutations include truncation at the C-terminus, the N-terminus, or both, or mutations changing charged residues to non-charges residues.

The operation at block 120 allows for crystallization of the biotin-binding protein on the electron microscopy grid. On-grid crystallization of the biotin-binding protein addresses the issue described above in which the transfer of a biotin-binding protein crystal onto an electron microscopy grid is itself plagued by inconsistency because touching a lipid monolayer with a carbon film imparts mechanical force that tends to distort the attached crystals (Brisson et al., 1999). In some embodiments, the biotin-binding protein is added to a small droplet of buffer that remains adhered on the hydrophilic face of the electron microscopy grid. Other affinity-binding systems, such as the FITC-anti-FITC (FITC—fluorescein isothiocyanate) system (Harmer and Samuel, 1989) or the use of other capture molecules, such as antibodies may, also be used in place of the biotin-binding protein.

At block 125, a period of time is allowed to elapse. The period of time allows the biotin-binding protein to crystallize. The standard protocol known and used in the art for growing monolayer crystals typically involves an additional incubation step of 2 hours or more (See Wang and Sigworth, 2010). However, in the method 100, in some embodiments the period of time is less than about 10 minutes. In some embodiments, the period of time is about 1 minute to 20 minutes.

When the electron microscopy grid is not going to be used immediately in an electron microscopy experiment after the period of time has elapsed at block 125, in some embodiments, small molecules are deposited on the biotin-binding protein. In some embodiments, the small molecules are soluble in water. In some embodiments, the small molecules are hydrophilic. In some embodiments, the small molecules are operable to preserve lipid and protein structure when water is removed. In some embodiments, the water is removed by evaporation. In some embodiments, the small molecules are selected from a group consisting of trehalose, glucose, betaine, proline, and glycine. In some embodiments, the small molecules are deposited on the biotin-binding protein in the form of a solution. The solvent of the solution (e.g., water) is then allowed to evaporate. In some embodiments, the small molecules form a layer on the biotin-binding protein that is about 50 nm to 150 nm thick, or about 100 nm thick. In some embodiments, the small molecules form a layer on the biotin-binding protein that is thicker than about 100 nm.

In some embodiments, a layer of carbon is deposited on the hydrophobic tails of the lipid monolayer. In some embodiments, the layer of carbon is deposited with an evaporation process. The layer of carbon may increase the consistency with which a well-ordered single crystal of the biotin-binding protein is obtained, spanning an entire hole in the holely carbon film. For example, a single crystal of the biotin-binding protein may span an about 1 micron to 2 micron hole in the holey carbon film. In some embodiments, the layer of carbon is about 5 nm or less in thickness. In some embodiments, the layer of carbon is deposited on the hydrophobic tails of the lipid monolayer after block 125 or after small molecules are deposited on the biotin-binding protein.

In some embodiments, before beginning the method 100, the electron microscopy grid is pretreated. In some embodiments, a pretreatment of the electron microscopy grid comprises immersing the electron microscopy grid in a solvent, depositing carbon on the first surface of the grid, and allowing a period of about 3 or more days to elapse. In some embodiments, immersing the electron microscopy grid in a solvent includes immersing the electron microscopy grid in chloroform and then immersing the electron microscopy grid in ethanol. In some embodiments, an evaporation method is used to deposit the carbon on the first surface of the grid.

While block 115 is described with reference to one hole in the holey carbon film, in some embodiments, a plurality of the holes in the holey carbon film undergo the operations described in blocks 115, 120 and 125.

Figure 1D:
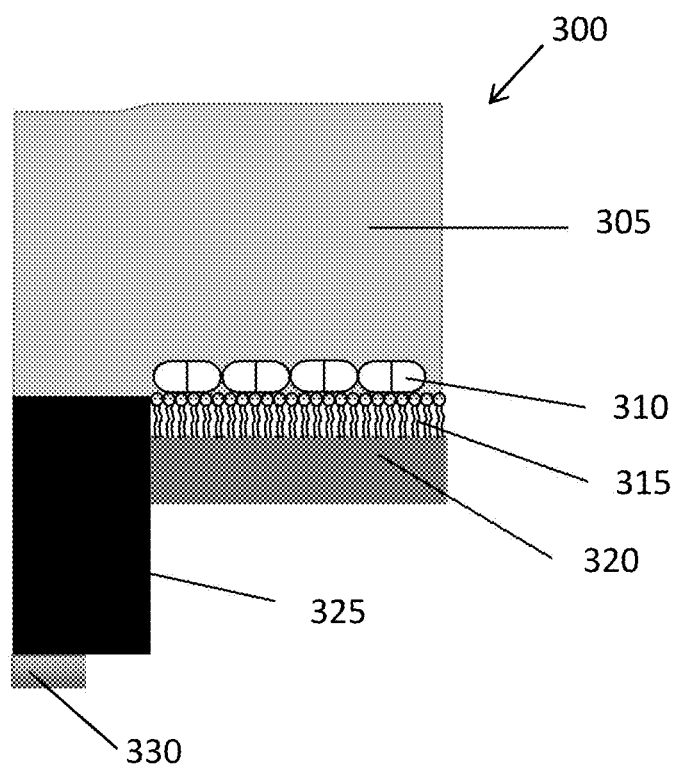
FIG. 1D shows an example of a cross-sectional schematic illustration of an arrangement including an electron microscopy grid.

FIG. 1D shows an example of a cross-sectional schematic illustration of an arrangement including an electron microscopy grid. The schematic illustration shown in FIG. 1D shows an area that is close to, and includes one edge of, a hole in the holey carbon film. The schematic illustration shown in FIG. 1D also shows an area that is close to, and includes one edge of, an opening in the mesh of the electron microscopy grid. The arrangement 300 shown in FIG. 1D includes a portion of an electron microscopy grid 330. The electron microscopy grid 330 includes a first surface and a second surface, with the first surface having a holey carbon film 325 disposed thereon. A plurality of lipid molecules 315 that form a lipid monolayer are disposed in a hole in the holey carbon film 325. A biotin-binding protein 310 is attached to the hydrophilic heads of the plurality of lipid molecules 315. In some embodiments, the biotin-binding protein 310 is crystalline. In some embodiments, biotin-binding protein 310 comprises a single crystal of the biotin-binding protein 310 and spans a hole in the holey carbon film 325. In some embodiments, the biotin-binding protein 310 consists of a single crystal of the biotin-binding protein 310 and spans a hole in the holey carbon film 325. In some embodiments, the arrangement includes small molecules 305 disposed on the biotin-binding protein 310. In some embodiments, a layer of carbon 320 is disposed on the hydrophobic tails of the plurality of lipid molecules 315.

Each lipid molecule of the plurality of lipid molecules 315 has a hydrophilic head and a hydrophobic tail. While the location of the plurality of lipid molecules 315 relative to the surface of the holey carbon film 325 is not known in molecular detail, the hydrophobic lipid tails are expected to be in contact with the edge of the carbon, which is hydrophobic, defining a hole in the holey carbon film 325, as shown in FIG. 1D. In some embodiments, the plurality of lipid molecules comprises a homogenous mixture of lipid molecules with biotinylated head groups. In some embodiments, the plurality of lipid molecules comprises a heterogeneous mixture of lipid molecules, with at least a part of the heterogeneous mixture comprising lipid molecules with biotinylated head groups.

The biotin-binding protein used is typically able to form well-ordered crystals. In some embodiments, the biotin-binding protein 310 is selected from a group consisting of streptavidin, avidin, NeutrAvidin, CaptAvidin, and tamavidins. In some embodiments, mutant versions of such biotin-binding proteins are used. In some embodiments, the mutations include truncation at the C-terminus, the N-terminus, or both, or mutations changing charged residues to non-charges residues.

In some embodiments, the small molecules 305 disposed on the biotin-binding protein 310 are soluble in water. In some embodiments, the small molecules 305 are hydrophilic. In some embodiments, the small molecules 305 are operable to preserve lipid and the protein structure when water is removed. In some embodiments, the small molecules 305 are selected from a group consisting of trehalose, glucose, betaine, proline, and glycine.

Figure 1E:
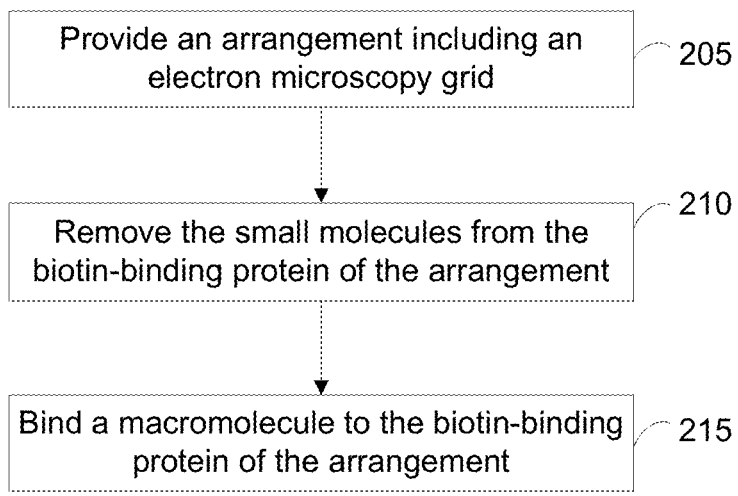
FIG. 1E shows an example of a flow diagram illustrating a method of using an arrangement including an electron microscopy grid.

FIG. 1E shows an example of a flow diagram illustrating a method of using an arrangement including an electron microscopy grid. At block 205 of the method 200, an arrangement including an electron microscopy grid is provided. In some embodiments, the arrangement is an arrangement 300 as described with respect to FIG. 1D. In the method 200 shown in FIG. 1E, the arrangement includes small molecules disposed on the biotin-binding protein.

At block 210, the small molecules are removed from the biotin-binding protein. The biotin-binding protein remains bonded to the hydrophilic heads of the plurality of lipid molecules that form the lipid monolayer. In some embodiments, the arrangement includes a layer of carbon disposed on the hydrophobic tails of the plurality of lipid molecules. The layer of carbon may serve to stabilize the biotin-binding protein during block 210. In some embodiments, block 210 is performed immediately prior to using the arrangement in an electron microscopy experiment. For example, blocks 210 and 215 may be performed and no more than about 30 minutes to 45 minutes may elapse before inserting the arrangement in an electron microscope.

In some embodiments, removal of the small molecules is performed by depositing a biotin-binding crystallization buffer on the small molecules followed by depositing a buffer on the arrangement, the buffer being specific to the macromolecule that is to be bound to the biotin-binding protein. In some embodiments, the depositing is performed by washing the arrangement with the buffers. The buffer specific to the macromolecule that is to be bound to the biotin-binding protein may aid in ensuring that the arrangement will not have any residual biotin-binding crystallization buffer disposed thereon and will be macromolecule-friendly; the biotin-binding crystallization buffer is generally biotin-binding protein-friendly but not macromolecule-friendly.

At block 215, a macromolecule is bound to the biotin-binding protein of arrangement. The macromolecule is a macromolecule that is to be examined in an electron microscope. The macromolecule is bound to the arrangement through affinity binding of the macromolecule to the biotin-binding protein. In some embodiments, a macromolecule is bound to the arrangement using techniques described in Han, Bong-Gyoon, et al. (2012). "Electron microscopy of biotinylated protein complexes bound to streptavidin monolayer crystals," Journal of Structural Biology 180: 249-253, which is hereby incorporated by reference. For example, macromolecules of interest can be tagged with biotin or a streptavidin-binding peptide and then bound to the biotin-binding protein with high affinity and specificity.

Example

The following examples are intended to be examples of the embodiments disclosed herein, and are not intended to be limiting.

Lipids.

The biotinylated lipid used here is 1,2-dipalmitoyl-sn-glycero-3-phosphoethanolamine-N-(cap biotinyl), supplied as a 10 mg/mL solution in chloroform/methanol/water. This was diluted to 1.0 mg/mL with a solution of chloroform/methanol/water and aliquoted into small volumes intended for a single usage. The aliquots were sealed under nirogen gas and stored at −80° C. No deterioration as a function of time was observed in the ability of such aliquots to produce high-quality streptavidin monolayer crystals. Nevertheless, as a precaution, we prepare new aliquots after a period of about 6 months.

Streptavidin.

Streptavidin (SA) as purchased was provided at a concentration of ~1 mg/mL, dissolved in 10 mM sodium phosphate pH 7.2 with 0.15 M NaCl. This was aliquoted in quantities intended for single use, frozen in liquid nitrogen, and stored at −80° C. Similar to what we do for the lipid, as a precaution, we prepare new aliquots of streptavidin after a period of about 6 months.

Protocol for Growing Monolayer Crystals Directly on Holey-Carbon EM Grids.

A lipid monolayer, cast on an air-water interface, is first picked up by touching the lipid from above with a hydrophobic, holey-carbon EM grid. This results in Langmuir-Schaefer transfer of patches of the monolayer that span the holes of the carbon film, as was discovered by (Kubalek et al., 1991). We presume that an additional, unwanted lipid monolayer is also transferred to the air-water surface of the small volume of buffer that adheres to the (now hydrophilic) face of the EM grid. Thus, to remove as much lipid as possible from the surface of the adhering drop, we touch the grid to three successive, 50 µL drops of subphase buffer sitting on parafilm. Next, SA is added to the small droplet of buffer that adheres to the face of the EM grid. The grid is then incubated long enough to allow binding and subsequent crystallization of SA. We refer to this technique as the "on-grid" crystallization method.

As shown in FIG. 2A, we cast the above-mentioned lipid monolayer on a small trough holding ~5 mL of subphase buffer consisting of 50 mM HEPES (pH 7.5), 0.15 M KCl, and 10% trehalose. Including trehalose in the subphase buffer serves only to eliminate the need for a buffer-exchange "wash" before air-drying. This simplification became possible after we observed that adding 10% trehalose has no effect on the quality of monolayer crystals of streptavidin. Before applying lipid, however, we first "dust" the air-water interface lightly with unscented talcum powder, and then we apply a small droplet 18 10 µL) of castor oil at the center. As the castor oil spreads, the advancing front of oil sweeps away contaminants at the air-water interface and compresses them to the perimeter of the trough. A Hamilton syringe is then used to delive ~0.5 µL of previously aliquoted lipid to the center of the trough. At this point the thin film of castor oil also serves as a "piston" to control the surface pressure of the lipid monolayer (Langmuir, 1917). We believe that the castor-oil piston is a desirable but not necessary element of our protocol. Using a trough, rather than smaller, individual wells, facilitates use of the castor-oil piston, and allows one to prepare multiple grids from a single lipid monolayer.

We wash Quantifoil grids (Quantifoil Micro Tools GmbH, Germany) by first dipping them into chloroform and then into 95% ethanol. We also apply an additional ~5 nm of evaporated carbon to the top side of Quantifoil grids and then allow these to "age" for at least three days to make the freshly evaporated carbon more hydrophobic. Just before use, we again wash these grids by dipping them into 95% ethanol. We have less experience with C-flat grids (Electron Microscopy Sciences, Hatfield, Pa.), but we have successfully used them as received, i.e. without depositing additional carbon. We prefer to use gold or molybdenum grids to copper grids.

In our current crystallization protocol, we dilute an aliquot of SA to a concentration of 0.2 mg/mL with subphase buffer, and we use 4 µL of diluted SA for each grid (shown in FIG. 2B). After applying SA to the EM grid, the crystals are grown within a humidity chamber. Care is taken to minimize evaporation by placing crushed ice on the tweezers, with the intent to cool the grid slightly below the ambient dew point. Whereas an incubation time of 1-2 minutes appears to be too short to ensure full crystal formation in which streptavidin tetramers bind to the biotinylated lipid and form monolayer crystals, we observed crystallization to be completed within 10 minutes.

Following an incubation time that, for convenience, is often about half an hour when doing many grids at a time, most of the unbound SA is washed away by placing the grid on top of a 200 µL drop of wash buffer. The composition of the wash buffer is 10% trehalose in 10 mM HEPES (pH 7.5), as before, but with the KCl concentration now reduced to 50 mM. After waiting several seconds, the floating grid is caught with a tweezers and lifted vertically until it separates from the wash drop. We believe that this step in the protocol may be the one in which the monolayer crystals of SA are at greatest risk of becoming fragmented or even lost completely. Even when crystals have been severely damaged (at this stage, as we believe), most, if not all, holes in the holey carbon film still remain covered by a monolayer of SA bound to biotinylated lipid.

Streptavidin Crystals are then Embedded in Trehalose and Backed with Evaporated Carbon.

After washing the grids to remove unbound SA, excess trehalose solution is gently "wicked off" by touching the edge of the grid to a piece of filter paper. The grid then is left on a filter paper with the wet side facing the air, and any remaining liquid on the grid is allowed to dry.

After the trehalose solution has dried, a thin layer (~5 nm or less) of evaporated carbon is deposited on the back side (lipid-tail side) of the EM grid. Grids are placed ~20 cm below a carbon-arc source, and evaporation is done at a vacuum of $10^{-5}$ torr or lower. We use carbon rods with a tip width of 1 mm, which require less power to evaporate, in order to minimize heating of the trehalose-embedded SA "target". To further minimize the risk of radiant heating, the carbon rod is heated very rapidly, resulting in breakage of the thin tip and a concomitant flash of evaporated carbon.

We believe that the integrity of the SA monolayer crystals may be especially at risk at any stage before a carbon backing is deposited onto the lipid tails. The reason for our concern is that pressure fluctuations must occur every time a grid is either touched to, or is separated from, a drop of buffer, due to the high surface tension. Our hypothesis is that these transient changes in pressure can cause the thin, membrane-like monolayers to bulge above or below the plane of the holes in the holey carbon film. Although the lipid monolayer is fluid and extensible, the SA crystals are not. Thus, if pressure-induced bulging causes the area of the lipid monolayer to increase by only a few percent, the SA crystals are likely to crack and not anneal properly as the bulging relaxes.

We take care to minimize the mechanical stresses that we believe to be associated both with fusion between, and rupture of, the air-water interfaces as the grid is moved from one drop to the next. We believe that, prior to backing the SA crystals with evaporated carbon, this step in the protocol may be the one in which the monolayer crystals of SA are at greatest risk of becoming fragmented or even lost completely.

We store the carbon-backed, trehalose embedded SA crystals at room temperature in a sealed container. We prefer to store grids over silica gel that is pink (but not white) to maintain a relatively constant value of humidity.

Just before use, the grid is rehydrated by touching to two successive, 50 µL drops of a solution of 10 mM HEPES (pH 7.5) with 150 mM KCl without trehalose and then left on a 100 µL drop of the same solution for 10 minutes. This same process is repeated a second time, with the intent being to rinse away all remaining trehalose. After that, the grid is further washed with whatever buffer is optimal for the macromolecular sample under investigation.

Preparation of Grids and Electron Microscopy of 70S Ribosomal Particles.

Ribosomes were purified from *E. coli* strain MRE600 using sucrose gradient centrifugation, as previously described (Blaha et al., 2000). Ribosome complexes were formed by incubating 1.5 µM deacylated tRNA$^{Phe}$ and 3 µM mRNA of sequence 5'-GGCAAGGAGGUAAAAUUCUA-CAAA-3' (SEQ ID NO:1) with 0.5 µM ribosomes at 37° C. for 15 minutes in the buffer A: 20 mM HEPES, pH 7.5/70 mM KCl/6 mM MgOAc/1 mM TCEP. The antibiotic spectinomycin at a concentration of 20 µM was added to the pre-formed complex and incubated an additional 10 minutes at 37° C.

Ribosomes were biotinylated by adding 5-fold excess of biotin-labeling reagent and incubated 20 minutes at room temperature. Excess unreacted biotin was removed by using 1 mL S300 Sephacryl (GE Healthcare, Little Chalfont, Buckinghamshire, United Kingdom) gel-filtration spin column. The column was equilibrated with Buffer A, and usually 50 µL of ribosome complex was loaded on the column and spun on a table centrifuge at 3200 rpm for 1 minute.

Grids were first washed 3 times with 50 µL drops of cold ribosome buffer, and then a 4 µL aliquot of ribosomes was applied at a concentration in the range of 20-40 nM. After incubating for 20 minutes, chilled and in a humidity box to minimize evaporation, as described above for growth of monolayer crystals, unbound ribosomes were washed away by touching to three successive, 50 µL drops of buffer.

To prepare negatively stained specimens, we added 4 µL of 2% uranyl acetate to the lens of buffer adhering to the rinsed grid, which then was mixed by repeated, gentle pipetting while on the grid. This was followed by two cycles in which 3 µL was removed from the grid and 4 µL of 2% uranyl acetate was again added. After the second cycle, the excess uranyl acetate solution that remained was removed by blotting with filter paper. Images were recorded with a Gatan CCD camera (Gatan, Inc., Pleasanton, Calif.) on a JEOL 1200 electron microscope (JEOL USA, Inc., Peabody, Mass.).

To prepare cryo-EM samples, the grid is transferred to the Vitrobot (FEI, Hillsboro, Oreg.) tweezers after washing away unbound ribosomes with ribosome buffer. The tweezers and grid were then loaded into the Vitrobot Mark IV chamber (FEI, Hillsboro, Oreg.), which was previously equilibrated at a temperature of 15° C. and a relative humidity setting of 100%. In order to standardize the volume of liquid on the grid before blotting, excess liquid was first wicked off by touching the bottom edge of the grid with filter paper, which was brought in through a side port of the Vitrobot chamber. Following this, 1.2 µL of sample buffer was then added to the wet face of the grid. The blotting time used was 5 s, with a force setting of 8, a blotting time of 3 seconds, and zero wait/drain time.

For routine evaluation of cryo-grids, images were recorded with a Gatan CCD camera (Gatan, Inc., Pleasanton, Calif.) on a Philips CM 200 (FEI, Hillsboro, Oreg.). High-resolution images were obtained with a Gatan K2 camera (Gatan, Inc., Pleasanton, Calif.) on an FEI low-base Titan (FEI, Hillsboro, Oreg.), using a Gatan cryo-holder (Gatan, Inc., Pleasanton, Calif.). In this latter case, images were recorded as dose-fractionated movies consisting of twenty 300 ms frames, each with an exposure of 1.2 electrons/$Å^2$ at the specimen. The pixel size in these images was 1.3 Å, referred to the specimen. The movie frames were aligned and summed with the motion-correction software developed by (Li et al., 2013).

Data Processing.

The "2dx" software package (Gipson et al., 2007) was used to unbend the SA lattice in a few of the images. This was done to sharpen the Bragg spots in the Fourier transforms, thereby increasing the resolution at which spots could be detected with a good signal-to-noise ratio.

In all other cases, Fourier filtration of Bragg peaks was used to remove the image of the SA crystal, without unbending, before particles were boxed for further analysis. To do this, a script was written in MATLAB (The MathWorks, Inc., Natick, Mass.) to identify all pixels where the magnitude of the Fourier transform of an image was higher than a user-defined value. The Fourier-transform magnitudes in such pixels, plus those in several adjacent pixels, were replaced by the average value of the surrounding background, and the phases were replaced by random values. The threshold value was adjusted manually, while looking at a display of the Fourier transform of an image, until all visible diffraction spots were removed.

Candidate ribosome particles were automatically boxed with a software tool provided in RELION (Scheres, 2012). Images, with candidate particles outlined, were edited manually, using the BOXER tool provided in EMAN (Tang et al., 2007) to remove initial candidates that were obviously aggregates or other undesired material. Three-dimensional classification of particles and subsequent refinement again used tools provided in RELION.

Characterization of the carbon-backed SA monolayer crystals. Obtaining monolayer crystals by the on-grid technique is quite reliable and reproducible. On the basis of our current work using LEGINON for automated data collection (Subway et al., 2005), we estimate the success rate to be well over 90 percent for getting images in which single SA crystals cover the full field of view. The estimated ice thickness was the only criterion used when selecting areas to be added to the data-collection queue, and no attempt was made to decide, in advance, whether the holes contained SA crystals. Nevertheless, until the monolayers have been backed with evaporated carbon, our experience indicates that their crystallinity may still be at considerable risk.

Figures 3A, 3B, 3C:
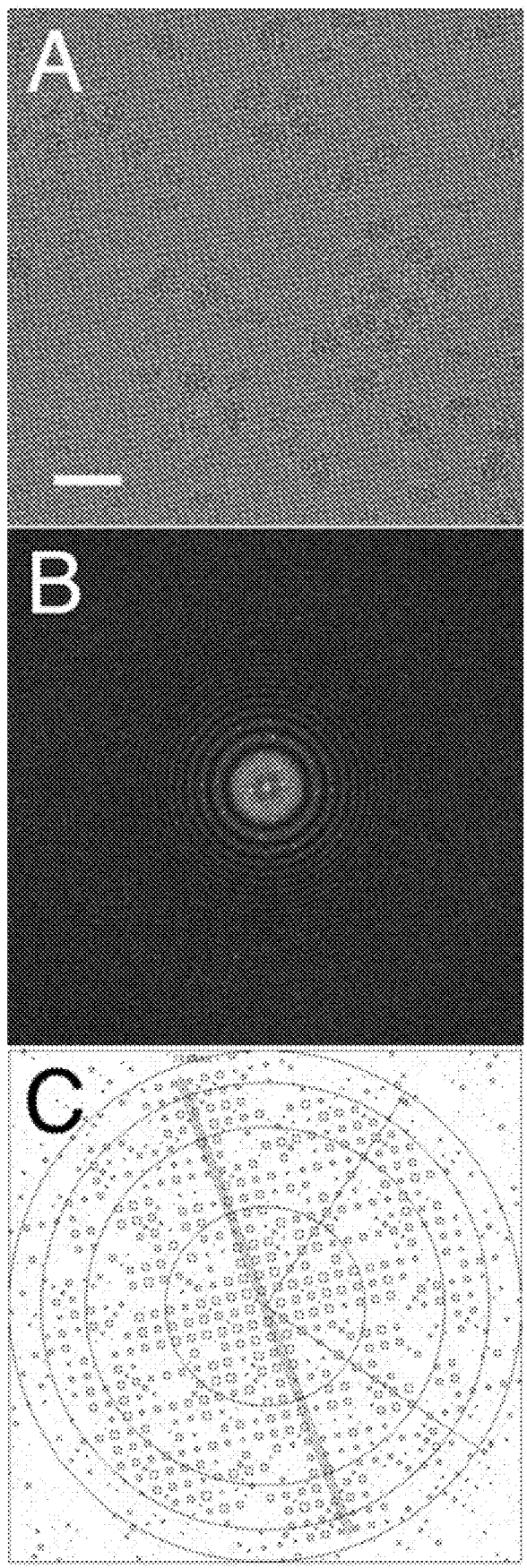
FIG. 3A shows an example of an image of a SA monolayer crystal after trehalose embedding, backing with evaporated carbon, and subsequent removal of trehalose just before use.
FIG. 3B shows an example of the raw Fourier transform of the image shown in FIG. 3A.
FIG. 3C shows an example of the Fourier transform of the "unbent" image, in which the Bragg spots are displayed as a so-called IQ plot.

The fact that these SA crystals remain well ordered after carbon coating, removal of trehalose, and application of a sample has been established by recording high-resolution images. One such image is shown in FIG. 3A, and the FFT of this raw, unprocessed image is shown in FIG. 3B. In addition to showing clear Thon rings from the evaporated carbon, the FFT also shows many Bragg peaks from the streptavidin monolayer crystal. The Fourier transform of the unbent image is shown in FIG. 3C. The Bragg spots in the FFT of the unbent image are represented by squares of various sizes, the largest corresponding to an IQ (Henderson et al., 1986) of 1 (estimated phase error of ~4 degrees) and the smallest corresponding to an IQ of 7 (estimated phase error of ~45 degrees). As in this example, Bragg spots with an IQ of 3 (estimated phase error of ~14 degrees) commonly extend to a resolution of 4 Å.

Finally, these grids are easy to prepare and use. The incubation time required to grow streptavidin-monolayer crystals by the on-grid technique is much shorter than the ~2 hours or more that has been recommended for crystallization by the micro-well technique (Wang and Sigworth, 2010). While we often use the SA support films within a week after first making them, we have confirmed that the SA lattice shows no signs of deterioration when stored for a month. We thus expect that the room-temperature shelf life will prove to be much longer than that.

Use of Randomly Biotinylated 70S Ribosome Particles as a Test Specimen.

Figure 4A:
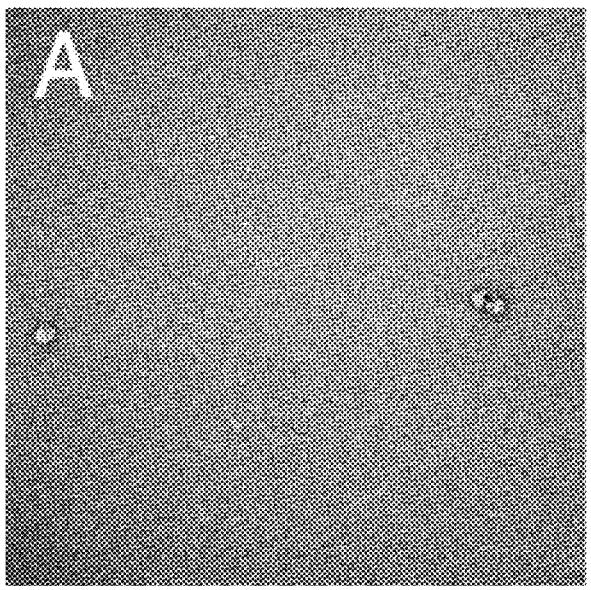
FIGS. 4A and 4B show examples of images demonstrating the effectiveness of binding randomly biotinylated 70S ribosomes to the SA monolayer-crystal support film.
Figure 4B:
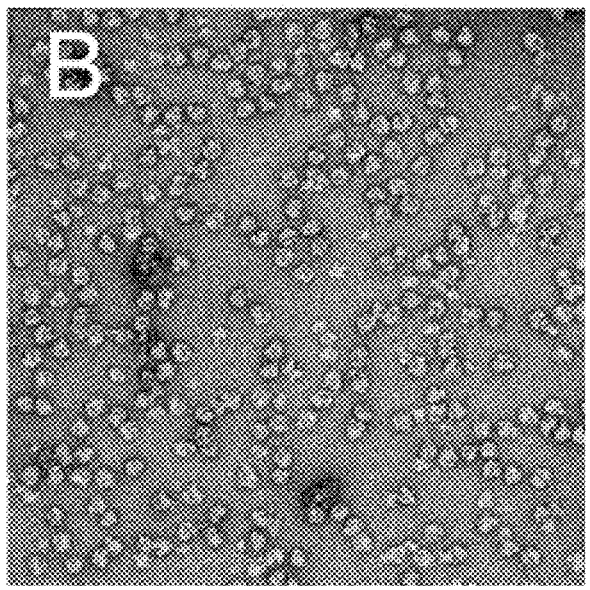

FIG. 4B shows that a high density of ribosome particles is obtained for the conditions of sample concentration and subsequent grid-washing as described above under Streptavidin crystals are then embedded in trehalose and backed with evaporated carbon. In a corresponding control experiment, using ribosomes that had not been biotinylated, few ribosomes remain on the support film, as is shown in FIG. 4A. We thus conclude that the biotin-binding functionality of streptavidin is retained throughout the process of trehalose embedding, carbon evaporation, and storage.

A set of 1497 movies were recorded in order to test the use of SA support films for single-particle data collection. After removing the SA background from these images, candidate ribosome particles were boxed automatically. This raw set was edited manually to produce a working data set of 101,213 particles. 3-D classification was then used to obtain structurally more homogeneous subsets of the working set.

Refinement of the largest such subset, consisting of 52,433 particles, produced the density map. The overall resolution of this map is estimated to be 4.0 Å, based on the point at which the "gold standard" FSC curve, falls to a value of 0.143. Focused refinement, based on the 50 S subunit, improved this only slightly, to just under 3.9 Å.

Streptavidin Affinity-Grids can be Used to Obtain High-Resolution Structures.

The resolution of the 3-D density map that we obtained for *E. coli* 70 S ribosomes, using SA monolayer crystals as a support film, is in line with that of maps obtained previously by others, using continuous carbon as a support film. A map at a somewhat lower resolution of ~5.1 Å was obtained by (Bai et al., 2013) for *T. thermophilus* 70 S ribosomes, but from a much smaller data set consisting of 15,202 particles. On the other hand, significantly higher-resolution maps have been obtained, this time for *E. coli* 70 S ribosomes, when using much larger data sets. A 3.0 Å map was obtained from 164,353 particles by (Brown et al., 2016), and an even higher-resolution structure was obtained by (Fischer et al., 2015) from 417,201 particles.

It is natural to be concerned that the periodic motif of the SA crystal might interfere with alignment and assignment of Euler angles for boxed particles. In principle, this should not be a problem because this background is easily removed by Fourier filtration when it is no longer of value to have it there (Han et al., 2012; Wang et al., 2008). Our success in obtaining a high-resolution density map of the 70 S ribosome particle confirms that removal of the periodic SA motif by Fourier filtering was as effective as it was expected to be.

Another concern is that nearly irreversible affinity binding could, in principle, trap the structure of a large complex in one or more off-pathway states. This could happen if some biotin residues are normally inaccessible for binding, for example those that are coupled to lysine residues within deep indentations of the surface. Transient fluctuations of the structure might nevertheless bring such biotin residues sufficiently far out that they would have access to a streptavidin binding site. We can again say that our success in obtaining a high-resolution density map rules out the hypothesis that the trapping of non-native structural variants contributes significantly to the structural heterogeneity of the data set.

Random Biotinylation can Result in Particles Adopting Many Orientations.

One of the major concerns about using affinity grids is that particles might be bound in a preferred orientation with respect to the support film. Chemical biotinylation of one or a few lysine residues per particle, used here, addresses this concern by placing affinity ligands as uniformly as possible over the surface of the particle.

Although the distribution of particle orientations in our case is clearly not uniform, there is sufficient coverage to adequately sample the 3-D Fourier transform of the ribosome particle. Fortunately, not all particle orientations need to be presented for the resulting 3-D structure factors to still be sampled completely. In fact, a complete sampling of Fourier space already occurs for rotation of an object about a single axis. In that case, the location of all projection directions is restricted to a great circle on the unit sphere. The Euler-angle distribution is actually far more complete than that.

As was indicated in Use of randomly biotinylated 70S ribosome particles as a test specimen, the distribution of surface locations where there are potential biotinylation sites agrees only partially, but not completely, with the pattern of densely populated Euler angles. The reasons for there being discrepancies can be complex, and the explanations, once determined, may not be generalizable. Variations in reactivity with the biotinylation reagent (which could be determined by mass spectroscopy of peptide fragments) could, for example, be one factor. Flexibility of protein subunits that are biotinylated is very likely to be another factor. In the latter case, flexible tethering of particles to the SA lattice might allow them to search locally for nonspecific, but preferred binding interactions that would, otherwise, be too weak to produce significant binding.

In addition, large portions of the Euler angle plot have only one or two particles that were assigned to each point. We are investigating whether an almost uniform background distribution, in which there are only one or two particles at a given angle, may reflect errors that are occasionally made in the process of projection matching, rather than binding that was not mediated by biotinylation—i.e. non-specific binding.

Significant Benefits are Expected from Using Streptavidin Affinity-Grids.

Affinity support films in general provide a number of features that are expected to be helpful for preparing cryo-EM grids. These include the fact that particles are bound at a single plane (single Z-height, for untilted specimens), which is important for CTF correction at high resolution. In addition, tethered particles are prevented from interacting with the air-water interface, provided that the aqueous sample is not too thin.

Affinity binding is, in general, expected to leave structures in a close-to-native state. Streptavidin affinity grids have the special feature that binding of the biotin ligand is essentially as strong as a covalent bond.

In addition, the background image of the SA lattice might serve as a fiducial to aid alignment of movie frames, and even sub-regions of frames. The background image of the SA lattice might also serve to track changes in tilt orientation that occur during the course of recording dose-fractionated images.

Value is Added by the Long Shelf-Life Feature of these Affinity Grids.

The step of preserving SA monolayer crystals over open holes required some optimization of the trehalose concentration, in combination with the blotting technique (i.e. wicking from the edge of the grid), used to leave a residual volume of solution to dry. The requirement for optimization is not too surprising in light of the fact that millimeter-scale droplets of aqueous trehalose can leave complex patterns of convection (e.g., colloidal-particle deposition), thickness, and stress (e.g., cracking) after drying by evaporation (Grant and Grigorieff, 2015). Spin-coating may be especially well-suited as a way to spread a thin film of trehalose (Abazari et al., 2014).

Trehalose is known to have superior properties for room-temperature preservation of freeze-dried phospholipid vesicles and proteins (Zhou, 2008). It has also been used extensively to preserve the high-resolution structure of thin protein crystals adsorbed to a carbon support film, a few examples of which are (Hebert et al., 1997; Leong et al., 2010; Tang et al., 2007). We note that other hydrophilic solutes might also work as well as does trehalose—see, for example, section 6.4 of (Glaeser et al., 2007).

CONCLUSION

Further details regarding the embodiments described herein can be found in the publication Bong-Gyoon Han, et al. "Long shelf-life streptavidin support-films suitable for electron microscopy of biological macromolecules," posted May 20, 2016 on biorxiv, which is herein incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

REFERENCES

Abazari, A., N. Chakraborty, S. Hand, A. Aksan, M. Toner, 2014. A Raman Microspectroscopy Study of Water and Trehalose in Spin-Dried Cells. Biophysical Journal 107, 2253-2262.

Bai, X.-c., I. S. Fernandez, G. McMullan, S. H. Scheres, 2013. Ribosome structures to near-atomic resolution from thirty thousand cryo-EM particles. eLife Sciences 2.

Blaha, G., U. Stelzl, C. M. T. Spahn, R. K. Agrawal, J. Frank, K. H. Nierhaus, 2000. Preparation of functional ribosomal complexes and effect of buffer conditions on tRNA positions observed by cryoelectron microscopy. Rna-Ligand Interactions Pt A 317, 292-309.

Brown, A., I. S. Fernandez, Y. Gordiyenko, V. Ramakrishnan, 2016. Ribosome-dependent activation of stringent control. Nature advance online publication.

Crucifix, C., M. Uhring, P. Schultz, 2004. Immobilization of biotinylated DNA on 2-D streptavidin crystals. Journal of Structural Biology 146, 441-451.

Darst, S. A., M. Ahlers, P. H. Meller, E. W. Kubalek, R. Blankenburg, H. O. Ribi, H. Ringsdorf, R. D. Kornberg, 1991. 2-Dimensional Crystals of Streptavidin on Biotinylated Lipid Layers and Their Interactions with Biotinylated Macromolecules. Biophysical Journal 59, 387-396.

Fischer, N., P. Neumann, A. L. Konevega, V. Bock, R. Ficner, M. V. Rodnina, H. Stark, 2015. Structure of the *E. coli* ribosome-EF-Tu complex at <3 A resolution by Cs-corrected cryo-EM. Nature 520, 567-570.

Gipson, B., X. Zeng, Z. Y. Zhang, H. Stahlberg, 2007. 2dx—User-friendly image processing for 2D crystals. Journal of Structural Biology 157, 64-72.

Glaeser, R. M., K. Downing, D. DeRosier, W. Chiu, J. Frank, 2007. Electron crystallography of biological macromolecules. Oxford University Press.

Grant, T., N. Grigorieff, 2015. Measuring the optimal exposure for single particle cryo-EM using a 2.6 Å reconstruction of rotavirus VP6. Elife 4, e06980.

Han, B. G., R. W. Walton, A. Song, P. Hwu, M. T. Stubbs, S. M. Yannone, P. Arbelaez, M. Dong, R. M. Glaeser, 2012. Electron microscopy of biotinylated protein complexes bound to streptavidin monolayer crystals. Journal of Structural Biology 180, 249-253.

Hebert, H., I. SchmidtKrey, R. Morgenstern, K. Murata, T. Hirai, K. Mitsuoka, Y. Fujiyoshi, 1997. The 3.0 angstrom projection structure of microsomal glutathione transferase as determined by electron crystallography of p2(1)2(1)2 two-dimensional crystals. Journal of Molecular Biology 271, 751-758.

Henderson, R., J. M. Baldwin, K. H. Downing, J. Lepault, F. Zemlin, 1986. Structure of Purple Membrane from *Halobacterium*-Halobium—Recording, Measurement and Evaluation of Electron-Micrographs at 3.5 a Resolution. Ultramicroscopy 19, 147-178.

Kubalek, E. W., R. D. Kornberg, S. A. Darst, 1991. Improved Transfer of 2-Dimensional Crystals from the Air-Water-Interface to Specimen Support Grids for High-Resolution Analysis by Electron-Microscopy. Ultramicroscopy 35, 295-304.

Langmuir, I., 1917. The constitution and fundamental properties of solids and liquids. II. Liquids. Journal of the American Chemical Society 39, 1848-1906.

Leong, P. A., X. K. Yu, Z. H. Zhou, G. J. Jensen, 2010. Correcting for the Ewald sphere in high-resoluiton single-particle reconstructions, p. 369-380, in: Jensen, G J, (Ed.), Methods in Enzymology, Vol 482: Cryo-Em, Part B: 3-D Reconstruction, Vol. 482, pp. 369-380.

Li, X. M., P. Mooney, S. Zheng, C. R. Booth, M. B. Braunfeld, S. Gubbens, D. A. Agard, Y. F. Cheng, 2013. Electron counting and beam-induced motion correction enable near-atomic-resolution single-particle cryo-EM. Nature Methods 10, 584-+.

Scheres, S. H. W., 2012. RELION: Implementation of a Bayesian approach to cryo-EM structure determination. Journal of Structural Biology 180, 519-530.

Suloway, C., J. Pulokas, D. Fellmann, A. Cheng, F. Guerra, J. Quispe, S. Stagg, C. S. Potter, B. Carragher, 2005. Automated molecular microscopy: The new Leginon system. Journal of Structural Biology 151, 41-60.

Tang, G., L. Peng, P. R. Baldwin, D. S. Mann, W. Jiang, I. Rees, S. J. Ludtke, 2007. EMAN2: An extensible image processing suite for electron microscopy. Journal of Structural Biology 157, 38-46.

Taylor, K. A., R. M. Glaeser, 2008. Retrospective on the early development of cryoelectron microscopy of macromolecules and a prospective on opportunities for the future. Journal of Structural Biology 163, 214-223.

Wang, L. G., F. J. Sigworth, 2009. Structure of the BK potassium channel in a lipid membrane from electron cryomicroscopy. Nature 461, 292-295.

Wang, L. G., F. J. Sigworth, 2010. Liposomes on a streptavidin crystal: a system to study membrane proteins by cryo-EM p. 147-164, in: Jensen, G J, (Ed.), Methods in Enzymology, Vol 481: Cryo-Em, Part a—Sample Preparation and Data Collection, Vol. 481, pp. 147-164.

Wang, L. G., P. Ounjai, F. J. Sigworth, 2008. Streptavidin crystals as nanostructured supports and image-calibration references for cryo-EM data collection. Journal of Structural Biology 164, 190-198.

Zhou, Z. H., 2008. Towards atomic resolution structural determination by single-particle cryo-electron microscopy. Current Opinion in Structural Biology 18, 218-228.

What is claimed is:

1. An arrangement comprising:
   an electron microscopy grid, the electron microscopy grid comprising a first surface and a second surface, the first surface having a holey carbon film disposed thereon;
   a plurality of lipid molecules disposed in a hole in the holey carbon film, the hole in the holey carbon film having a dimension of about 1 micron to 2 microns, each lipid molecule of the plurality of lipid molecules having a hydrophilic head and a hydrophobic tail;
   a biotin-binding protein attached to hydrophilic heads of the plurality of lipid molecules, the biotin-binding protein being crystalline, a crystal of the biotin-binding protein spanning the hole in the holey carbon film; and
   small molecules disposed on the biotin-binding protein, the small molecules operable to preserve a structure of the biotin-binding protein at room temperature.

2. The arrangement of claim 1, wherein the small molecules form a layer, and wherein the layer is about 50 nanometers to 150 nanometers thick.

3. The arrangement of claim 1, further comprising:
   a layer of carbon disposed on hydrophobic tails of the plurality of lipid molecules.

4. The arrangement of claim 3, wherein the layer of carbon has a thickness of 5 nanometers or less.

5. The arrangement of claim 1, wherein the plurality of lipid molecules comprises a homogenous mixture of lipid molecules with biotinylated head groups.

6. The arrangement of claim 1, wherein the plurality of lipid molecules comprises a heterogeneous mixture of lipid molecules, and wherein at least a part of the heterogeneous mixture comprises lipid molecules with biotinylated head groups.

7. The arrangement of claim 1, wherein the biotin-binding protein comprises streptavidin.

8. The arrangement of claim 1, wherein the small molecules are selected from a group consisting of trehalose, glucose, betaine, proline, and glycine.

9. The arrangement of claim 1, wherein the holey carbon film is about 10 nanometers to 25 nanometers thick.

10. A method comprising:
(a) providing an electron microscopy grid, the electron microscopy grid comprising a first surface and a second surface, the first surface having a holey carbon film disposed thereon;
(b) providing a plurality of lipid molecules, each lipid molecule of the plurality of lipid molecules having a hydrophilic head and a hydrophobic tail;
(c) contacting the holey carbon film with hydrophobic tails of the plurality of lipid molecules to form a lipid monolayer disposed in a hole in the holey carbon film, the lipid monolayer comprising a portion of the plurality of lipid molecules;
(d) after operation (c), attaching a biotin-binding protein to hydrophilic heads of the lipid monolayer; and
(e) after operation (d), allowing a period of time to elapse to allow the biotin-binding protein to crystalize while being attached to the hydrophilic heads of the lipid monolayer disposed in the hole in the holey carbon film.

11. The method of claim 10, further comprising:
depositing small molecules on the biotin-binding protein after operation (e).

12. The method of claim 10, further comprising:
depositing a layer of carbon on the hydrophobic tails of the lipid monolayer.

13. The method of claim 10, further comprising:
removing the biotin-binding protein that is not attached to the hydrophilic heads of the lipid monolayer after operation (d).

14. The method of claim 10, wherein the period of time in operation (e) is about 1 minute to 20 minutes.

15. The method of claim 10, wherein the plurality of lipid molecules comprises a homogenous mixture of lipid molecules with biotinylated head groups.

16. The method of claim 10, wherein the plurality of lipid molecules comprises a heterogeneous mixture of lipid molecules, and wherein at least part of the heterogeneous mixture comprises lipid molecules with biotinylated head groups.

17. The method of claim 10, wherein the biotin-binding protein comprises streptavidin.

18. The method of claim 11, wherein the small molecules are selected a group consisting of trehalose, glucose, betaine, proline, and glycine.

19. The method of claim 10, wherein the holey carbon film is about 10 nanometers to 25 nanometers thick, and wherein the hole in the holey carbon film has dimensions of about 1 micron to 2 microns.

20. The arrangement of claim 1, wherein the hole in the holey carbon film has dimensions of about 2 microns.

21. The method of claim 11, wherein the small molecules form a layer, and wherein the layer is about 50 nanometers to 150 nanometers thick.

* * * * *